US006403146B1

(12) United States Patent
Larson et al.

(10) Patent No.: US 6,403,146 B1
(45) Date of Patent: Jun. 11, 2002

(54) PROCESS FOR THE MANUFACTURE OF PRINTED CIRCUIT BOARDS

(76) Inventors: Gary B. Larson, 33 Surrey Dr., Cheshire, CT (US) 06410; Donna Kologe, 56 Woodruff Ave., Thomaston, CT (US) 06787; Cynthia Retallick, 38 Bonny View Rd., West Hartford, CT (US) 06107; Austin Wells, 77 Notley Road, Braintree, Essex CM7 7HE (GB)

( * ) Notice: Subject to any disclaimer, the term of this patent is extended or adjusted under 35 U.S.C. 154(b) by 1485 days.

(21) Appl. No.: 08/814,901

(22) Filed: Mar. 12, 1997

Related U.S. Application Data

(63) Continuation of application No. 08/440,664, filed on May 15, 1995, now abandoned, which is a continuation-in-part of application No. 08/296,706, filed on Aug. 26, 1994, now Pat. No. 5,474,798.

(51) Int. Cl.[7] .................................................. B05D 5/12
(52) U.S. Cl. .......................... 427/97; 427/98; 427/259; 427/272; 427/282; 216/17; 216/105
(58) Field of Search .............................. 427/96–98, 259, 427/265, 272, 282, 154; 205/125, 126; 216/41, 44, 105, 17

(56) References Cited

U.S. PATENT DOCUMENTS

| 3,628,999 | A | * | 12/1971 | Schneble, Jr. et al. | ...... 117/212 |
| 3,907,621 | A | * | 9/1975 | Polichette et al. | ............ 156/18 |
| 4,551,488 | A | * | 11/1985 | Leech et al. | ................ 523/427 |
| 4,876,177 | A | | 10/1989 | Akahoshi et al. | |
| 4,897,118 | A | | 1/1990 | Ferrier et al. | |
| 4,931,148 | A | | 6/1990 | Kukanskis et al. | |
| 5,235,139 | A | * | 8/1993 | Bengston et al. | ........... 174/257 |

FOREIGN PATENT DOCUMENTS

| GB | 1207631 | | 10/1970 |
| GB | 1259304 | | 1/1972 |
| GB | 26145 | * | 12/1993 |
| WO | 9326145 | | 12/1993 |

* cited by examiner

Primary Examiner—Brian K. Talbot
(74) Attorney, Agent, or Firm—Carmody & Torrance LLP

(57) ABSTRACT

The present invention relates to a process for the manufacture of printed circuit boards. The method contemplates a novel processing sequence for this manufacturing process which method is particularly versatile in reducing the number of steps and variety of chemicals currently necessary to produce the circuit boards.

10 Claims, No Drawings

PROCESS FOR THE MANUFACTURE OF PRINTED CIRCUIT BOARDS

This application is a continuation of application Ser. No. 08/440,664 filed May. 15, 1995, now abandoned.

This Application is a continuation-in-part of U.S. patent application Ser. No. 08/296,706 filed Aug. 26, 1994 U.S. Pat. No. 5,474,798.

FIELD OF THE INVENTION

The present invention relates to a process for the manufacture of double-sided and multi-layer printed circuit boards. The method proposed contemplates a specific manufacturing sequence and the use of electroless nickel for providing the necessary interconnections for building the circuitry to the desired thickness and as an etch resist. The method is particularly versatile in reducing the number of steps and variety of chemicals currently necessary to produce these circuit boards.

BACKGROUND OF THE INVENTION

In the manufacture of printed circuit boards, it is now commonplace to produce printed circuitry on both sides of a planar rigid or flexible insulating substrate. Of increased importance is the manufacture of multi-layer printed circuits which consist of parallel, planar, alternating inner layers of insulating substrate material and conductive metal. The exposed outer sides of the laminated structure are provided with circuit patterns, as with double-sided boards, and the inner layers themselves may contain circuit patterns.

In double-sided and multi-layer printed circuit boards, it is necessary to provide conductive interconnection between and among the various layers and/or sides. This is commonly achieved by providing copper plated through-holes. Copper is provided in various ways such as by electroless or electrolytic deposition or combinations thereof.

In terms of providing the desired circuit pattern on the board, the art has developed a variety of manufacturing sequences, many of which fall into the broad categories of subtractive or additive techniques. Common to the subtractive processes is the need to etch away (or subtract) metal to expose the desired circuit patterns. Additive processes, on the other hand, begin with clean dielectric substrate surfaces and build up thereon metallization in desired areas only, the desired areas being those not masked by a previously applied pattern of plating resist material. While avoiding the problems associated with the etching required in subtractive processes, additive processes have their own inherent difficulties in terms of the choice of resist materials, the ability to build up the full metallization thickness desired by electroless methods, the relatively long time periods required to electrolessly build the desired thickness'and weaknesses in the physical properties of most electroless copper, deposits.

U.S. Pat. No. 4,897,118 (Ferrier et. al), whose teachings are incorporated herein by reference, reveals a process for selective metallization a substrate in a predetermined desired pattern (i.e. additive technology). Ferrier et. al. discussed additive technology, proposed certain improvements thereto, and give a fair picture of the current state-of-the-art in this area. The current invention proposes improvements thereto which provide significant advantages in reducing the number of steps and chemicals involved in the fabrication thereby making the fabrication process more economical and feasible.

The prior art additive processes suffered from a variety of problems. Firstly, most plating masks currently used in the industry are strippable in alkaline solutions. Electroless copper baths are invariably alkaline, usually very alkaline, with pH's in excess of 12. Therefore, known plating resists have great difficulty in maintaining their integrity and adhesion to the board surface when subjecting to plating in electroless copper baths, particularly when the long plating periods required by these techniques (8 to 24) hours are taken into consideration. When the plating mask loses its integrity and/or adhesion to the surface, circuit definition fails. Thus the current invention's proposal of the use of a permanent solder mask as both a solder mask and a plating resist overcomes these problems. For a discussion of soldermasks, their composition and uses, see U.S. Pat. No. 5,296,334, the teachings of which are incorporated herein by reference in their entirety. The permanent nature of the solder mask makes it much more resistant to subsequent processing solutions. The application of solder mask prior to the formation of holes in the printed circuit board has not, heretofore, been attempted. As can be seen from this invention disclosure, several benefits flow from this early application of solder mask. Secondly, the plating rates of electroless copper baths are relatively slow, usually averaging about 60 to 80 microinches per hour. In comparison, electroless nickel plating rates are about 5 times faster, averaging about 350 microinches per hour. Thus, the production rate utilizing electroless nickel can be approximately 5 times that of electroless copper.

SUMMARY OF THE INVENTION

The present invention proposes an improved process for the manufacture of printed circuit boards. The method provides various advantages over the prior art, including reduced number of cycle steps, reduced number and types of necessary chemical treatments and increased manufacturing efficiency. This method thus overcomes many difficulties experienced with prior methods.

The method currently proposed contemplates a specific manufacturing sequence for the production of printed circuit boards in combination with electroless plating for building circuitry to thickness. The most preferred form of electroless plating in this application is electroless nickel. The following basic production cycle is proposed for implementation of this invention:

1. Form circuitry (either double sided or multi layer package)
2. Apply a solder mask
3. Apply a de-sensitizing mask
4. Drill or punch the desired holes
5. Activate holes
6. Strip away the desensitizing mask
7. Initiate plating (electroless copper or electroless nickel-boron)
8. Electroless Plate to desired thickness (additive electroless copper or electroless nickel-phosphorous)
9. Final finish Various optional steps may be added to this basic cycle to suit the particular needs of the fabricator. As used herein, and in the claims, copper clad laminate shall include multilayer circuitry packages as well as double sided circuitry packages.

DETAILED DESCRIPTION OF THE INVENTION

The present method is an improvement upon the additive techniques for the production of printed circuits. The present invention proposes a type of semi-additive technique. The invention addresses many, if not all, of the concerns and problems experienced by past techniques through the use of a specific processing sequence. The processing sequence allows the application of a permanent coating, the solder mask, very early in the stages of printed circuit production as opposed to at the end of the processing. This early application of the solder mask provides several advantages. Firstly, the solder mask acts as a resist in the electroless plating. Because the solder mask is a permanent casting, it easily maintains adhesion and resists the various processing solutions, whereas the prior art temporary resists frequently lost adhesion in these types of processing sequences. Secondly, the solder mask acts both as a solder mask and a plating resist, thus providing efficiency.

The present invention proposes the following basic cycle for the production of double-sided and multilayer printed circuit boards:

1. Form circuitry (either double sided or multilayer package)
2. Apply a solder mask
3. Apply a desensitizing mask
4. Drill or punch the desired holes
5. Activate holes
6. Strip away the desensitizing mask
7. Initiate plating
8. Plate to thickness
9. Optionally, final finish The first step calls for the formation of circuitry. In the case of a double sided board, this step would begin with copper clad laminate material followed by the following print and etch sequence. The copper clad laminate material is then imaged on both sides with an etch resist such that the desired circuitry is covered by the etch resist and the remainder of the copper is exposed. The material is then subjected to an etchant such that the exposed copper is etched away allowing the resist covered copper circuitry to stand out in vertical relief. The etch resist is then stripped away revealing the defined copper circuitry on the epoxy-glass laminate. In multilayer applications several of these circuit patterns are laminated together to yield a multilayer package of circuitry with inner layers and outlayers.

In the second step the double-sided or multilayer circuitry from the first step is then coated on its outer surfaces with a permanent solder mask coating. The solder mask can be applied in several ways including dry film, roller coating, curtin coating, screening, or various similar techniques. Generally the solder mask is imaged so that various areas of connection including holes, pads, lands, tabs and similar features (collectively "areas of connection") are exposed. These areas of connection are copper areas where components are later connected to the board or other connections are made to the board. The solder mask can be imaged in various ways including screening, photoimaging followed by development, or similar techniques.

Next, a desensitizing mask is coated on top of the solder mask. The desensitizing mask is imaged such that all of the solder mask is covered, but such that the areas of connection and holes are left exposed. The desensitizing mask can be any non-permanent resist which can be appropriately applied, leaving the areas of connection exposed, and which is resistant to the subsequent processing steps.

The boards are then drilled or punched with holes or vias. Thus, holes will penetrate through the entire board including the solder mask and desensitizing mask on both exterior surfaces. Vias may penetrate through the desensitizing mask and solder mask on one side of the board into the interior of the board but not through to the other side.

Next, the holes are activated to accept plating. Activation of the holes can range in complexity from a single dip in a precious metal activator (or other non-precious metal activates known in the art) to a full DESMEAR (or etch bath), plated though-hole cycle involving numerous steps. The most complex hole activation cycle might consist of hold condition (m-Pyrol), potassium permanganate desmear, neutralization (acid/reducer), glass etch (Ammonium Bifluoride)), conditioner (surfactant or other type), microetch, activator ($PdCl_2/SnCl_2$ Colloid) and accelerator. Clean water rinses are interposed between each chemical treatment. Various combinations will be apparent to those skilled in the art. Regardless of which hole activation cycle is chosen, its primary purpose is to treat the holes so that the hole surfaces will initiate electroless plating. A wide variety of methods for achieving this are known in the art, any of which may be advantageously be utilized here. Please refer to U.S. Pat. No. 5,032,427 (Kukanskis et al.), U.S. Pat. No. 4,976,990 (Bach et al), U.S. Pat. No. 4,608,275 (Kukanskis et al.) and U.S. Pat. No. 4,863,758 (Rhodenizer), the teachings all of which are incorporated herein by reference in their entirety.

Once activation of the holes is complete, the desensitizing mask is stripped from the surface of the boards. The particular stripping solution for the desensitizing mask will depend upon the specific mask used. Many non-permanent masks are easily stripped in alkaline solution. Non-permanent masks or resists which can be used as the desensitizing masks in this invention are widely known and utilized in the industry for a wide range of other purposes. Typical desensitizing masks might include dry film masks (resists) available from Dupont Company, Hercules Company or Dynachem, inc. In addition screen printable or liquid photoimageable non-permanent masks are also available from such companies as MacDermid, Incorporated or Ciba-Geigy.

The next step is to initiate plating in the holes and possibly upon the areas of connection. This initiation can occur in several ways. One preferred example is through the application of electroless copper. Another is through the application of electroless nickel-boron. Either of these solutions will initiate plating upon the activated areas only. Thus, the holes and other areas of connection will be plated but the remainder of the unactivated (desensitized) solder mask surface will not.

The next step could be a continuation of the previous step, or, it could be a separate step as indicated on the former sequence. The object of this step is to plate the holes and other areas of connection to the appropriate metal thickness. Thus, if an appropriate electroless copper is used in the previous step, the board could be left in the electroless copper for an extended time to build the appropriate thickness of copper. One preferred method, however is to initiate plating in the previous step with electroless copper (10 to 150 microinches of copper) and then to follow that initiation with either electroless nickel phosphorous or a strike of electroless nickel-boron followed by electroless nickel-phosphorous.

The final step is optional, but recommended. This step consists of applying some form of final finish to the holes and other areas of connection. These final finishes have as their objective, the protection and/or enhancement of the solderability of these surfaces. A final finish may take one of many forms. It may consist of an organic treatment which preserves and enhances the solderability of these surfaces, such as is described in U.S. Pat. No. 5,362,334 (Adams et al.), the teachings of which are incorporated herein by reference in their entirety. Alternatively it may consist of a series of metallic treatments, possibly culminating in a precious metal coating as described in U.S. Pat. Nos. 5,235, 139, the teachings of which are both incorporated herein by reference in their entirety.

Various additional steps may be inserted between the steps of the proposed process sequence. In addition, substitutions may also be made. These insertions or substitutions may be such as would be obvious to one skilled in the art.

This invention is further described in the following examples which are given for illustrative purposes only, and are in no way limiting.

EXAMPLE I

A printed circuit board was fabricated in the following manner according to the teachings of this invention:

1. A sized piece of copper clad laminate was coated with a dry film etch resiston both copper surfaces. The etch resist was then exposed, imaged and developed so that the etch resist covered only those areas of copper which were to remain. The laminate was then subjected to etching whereby the circuits were defined by etching away all exposed copper. The etch resist was then stripped away.
2. A photoimageable solder mask was then applied to the surfaces. The solder mask was then exposed, imaged and developed such that substantially the entire surfaces of the board were covered except for the areas of connection.
3. A dry film plating mask (desensitizing mask) was then laminated over the surfaces of the solder mask. The desensitizing mask was then exposed imaged and developed such that it covered substantially the entire surfaces of the solder mask except for the areas of connection.
4. Holes were then drilled through entire package in the desired anoy.
5. The holes were activated to accept and initiate plating on their surface by subjecting the boards to the following treatments:
   a. Cleaner/conditioner (MacDermid 9420) for four minutes at 110° F. by immersion therein.
   b. Activation (MacDermid MacTriate 10) for four minutes at 110° F. by immersion therein.
*Rinsing is provided between steps.
6. The desensitizing mask is then stripped away using an aqueous alkaline resist stripping solution. Accelleration of the activated surfaces was also achieved in this stripping step.
7. The plating was initiated by immersing the boards in MacDermid M-85 electroless copper bath for fifteen minutes at 115° F. A total of 100 microinches of electroless copper was plated. Plating occurred only in the holes and on other areas of connection. MacDermid Electroless nickel-boron bath was utilized to plate approximately two microinches of nickel-boron onto the exposed copper surfaces.
8. The boards were then plated to thickness by immersing them in MacDermid Electroless Nickel-Phosphorous solution for 180 minutes at 190° F. Approximately 1150 microinches of nickel-phosphorous was plated in the holes and on the other areas of connection.

Please note that fresh water rinses were interposed after each chemical operation given above.

EXAMPLE II

A printed circuit board was fabricated in the same manner as in Example I, except that after Step 8 thereof the board was further processed in the following manner:

a. The board was immersed in MacDermid 9271 cleaner to clean and activate the exposed metallic surfaces.

b. The exposed metallic surfaces were then plated with twenty microinches of electroless palladium by immersion in MacDermid Electroless Palladium both for twenty minutes at 160° F.

EXAMPLE III

A printed circuit board was fabricated in the same manner as in Example II, except that Step 7 was replaced by the following:

7. The plating was initiated by immersing the boards in MacDermid Electroless Nickel-boron for one minute at 115° F. Approximately two microinches of Nickel-boron was plated in the holes and on the other areas of connection.

EXAMPLE IV

A printed circuit board was fabricated in the same manner as in Example I except that Step 7 was eliminated.

EXAMPLE V

A printed circuit board was fabricated in the same manner as in Example II except that Step 3 was modified in the following manner: A desensitizing mask was screened over the surfaces of the solder mask such that it covered substantially the entire surfaces of the solder mask except for the holes and other areas of connection.

EXAMPLE VI

A printed circuit board was fabricated in the same manner as in Example II, except that the board was a multilayer board and therefore Step 1 was modified as follows:

1. Several sized pieces of copper clad laminate were coated with a dry film etchresist on each side. The layers were then individually exposed, im aged and developed to reveal their respective circuit patterns. The layers were then etched and the resist stripped. The layers were then laminated into a multilayer package with copper foil on both exterior surfaces and the various inner-layers in between (ie. a copper clad laminate). The outer surfaces of copper foil were then imaged and etched to reveal the desired outer circuitry.

EXAMPLE VII

A printed circuit board was fabricated in the same manner as in Example VI, except that the board was subject to a desmear operation after Step 4 but prior to Step 5. The desmear operation consists of the following steps:

a). Solvent Swell—(MacDermid 9204), 2 minutes, 100° F.

b). Potassium Permanganete (MacDermid 9275), 60 gr/l, 10 minutes, 160° F.

c). Neutralizer (MacDermid 9279), 110° F., 5 minutes.

*Note. Fresh water rinses were interposed between each chemical step.

The printed circuit boards in all the above examples were tested in a variety of ways including standard solder shock tests, conductivity tests, cross section tests, and various functional testing. The results of all testing revealed that all of the printed circuit boards produced, functioned acceptably, for the purposes intended.

As can be seen from the current specification, the proposed process has many advantages over the prior art processes. One of the most important advantages is that it provides an efficient method of producing printed circuit boards which substantially reduces the number of required steps and processes required. In addition, the proposed process provides a workable semi-additive approach to producing printed circuit boards. The dual use of the solder mask both as a solder mask and as a plating resist enables this process to overcome many of the shortcomings of prior additive and semi-additive processes.

What is claimed is:

1. A process for producing printed circuit boards, which process comprises the steps of:
    (a) forming circuitry, comprising circuits, pads, lands and tabs, on a copper clad laminate;
    (b) applying a registered solder mask over substantially all of the circuitry and other portions of the laminate in an imagewise manner;
    (c) applying a single imaged desensitizing mask over the solder mask; thereafter
    (d) forming holes in an array;
    (e) activating said holes to accept plating thereon; thereafter
    (f) stripping the desensitizing mask thereby revealing the solder mask; and thereafter
    (g) plating the holes.

2. A process according to claim 1 wherein Step (a) comprises:
    (a) Coating the copper clad laminate with an etch resist;
    (b) Imaging and developing said etch resist such that the etch resist forms a positive image of the circuitry;
    (c) Subjecting said copper clad laminate to an etching operation which etches away substantially all of the exposed copper; and
    (d) Stripping the etch resist.

3. A process according to claim 1 wherein Step (b) comprises:
    (a) Applying a photoimageable solder mask over substantially all of the circuitry and other portions of the laminate;
    (b) Exposing and developing said photoimageable solder mask such that the solder mask covers substantially all of said circuitry except for the pads, lands and tabs:
    (c) Curing said developed solder mask to form a permanent coating.

4. A process according to claim 1 wherein Step (c) comprises:
    Screening a desensitizing mask over the solder mask such that substantially all of the solder mask is covered with the desensitizing mask and thereafter curing said desensitizing mask to form a removable coating.

5. A process according to claim 1 wherein Step (e) comprises:
    (a) Subjecting said holes to a conditioner which enhances the ability to activate and plate said holes; and
    (b) Thereafter subjecting said holes to an activator which enhances the platability of said holes.

6. A process according to claim 1 wherein Step (g) comprises:
    (a) Subjecting said holes to electroless nickel-boron plating; and
    (b) Thereafter subjecting said holes to electroless nickel-phosphorous plating.

7. A process according to claim 1 wherein Step (g) comprises:
    (a) Subjecting said holes to electroless copper plating;
    (b) Thereafter subjecting said holes to electroless nickel-boron plating; and
    (c) Thereafter subjecting said holes to electroless nickel-phosphorous plating.

8. A process according to claim 1 wherein Step (g) comprises subjecting said holes to electroless nickel-phosphorous plating.

9. A process according to claim 1 wherein after Step (g) the boards are subjected to a final finish process comprising a process selected from the group consisting of (i) an organic coating which enhances the solderability of the holes, pads, lands and tabs, (ii) plating the holes pads lands and tabs with a precious metal, (iii) plating the holes, pads, lands and tabs with nickel followed by plating said holes, pads, lands and tabs with a precious metal, and (iv) combinations thereof.

10. A process according to claim 1 wherein:
    (a) step (a) comprises:
        (1) coating the copper clad laminate with an etch resist;
        (2) imaging and developing said etch resist such that the etch resist forms a positive image of the circuitry;
        (3) subjecting said laminate to an etching operation which etches away substantially all of the exposed copper;
        (4) stripping the etch resist; and
    (b) step (b) comprises:
        (1) applying a photoimageable solder mask over substantially all of the circuitry and other portions of the laminate;
        (2) exposing and developing said photoimageable solder mask such that the solder mask covers substantially all of said circuitry except for the pads, lands, and tabs,
        (3) curing said developed solder mask to form a permanent coating; and
    (c) step (c) comprises screening a desensitizing mask over the solder mask such that substantially all of the solder mask is covered with the desensitizing mask and thereafter curing said desensitizing mask to form a removable coating; and
    (d) step (d) comprises:
        (1) subjecting said holes to a conditioner which enhances the ability to activate and plate said holes;
        (2) thereafter subjecting said holes to an activator which enhances the platability of said holes; and
    (e) step comprises electrolessly plating the holes, pads, lands and tabs;
    (f) thereafter subjecting said holes, pads, lands and tabs, to precious metal plating.

* * * * *

UNITED STATES PATENT AND TRADEMARK OFFICE
CERTIFICATE OF CORRECTION

PATENT NO. : 6,403,146 B1  Page 1 of 1
DATED : June 11, 2002
INVENTOR(S) : Gary B. Larson et al.

It is certified that error appears in the above-identified patent and that said Letters Patent is hereby corrected as shown below:

Title page,
Item [56], References Cited, please add the following under U.S. PATENT DOCUMENTS:
-- 5,348,590    A    *    9/1994    Shigemura et al --
-- 4,486,466    A    *    12/1984    Leech et al --
Please delete the following under FOREIGN PATENT DOCUMENTS:
-- GB   26145    *    12/1993 --

Column 8,
Line 58, please insert -- (g) -- between the words "step" and "comprises."

Signed and Sealed this

Nineteenth Day of November, 2002

Attest:

Attesting Officer

JAMES E. ROGAN
Director of the United States Patent and Trademark Office